(12) United States Patent
Kahrizi et al.

(10) Patent No.: US 8,208,877 B2
(45) Date of Patent: Jun. 26, 2012

(54) DIGITAL MODULATOR AND METHOD FOR INITIATING RAMP POWER TRANSITIONS IN A MOBILE HANDSET TRANSMITTER

(75) Inventors: Masoud Kahrizi, Irvine, CA (US); John E. Vasa, Irvine, CA (US); Darioush Agahi, Irvine, CA (US)

(73) Assignee: Intel Corporation, Santa Clara, CA (US)

( * ) Notice: Subject to any disclaimer, the term of this patent is extended or adjusted under 35 U.S.C. 154(b) by 1041 days.

(21) Appl. No.: 12/052,635

(22) Filed: Mar. 20, 2008

(65) Prior Publication Data

US 2008/0233994 A1 Sep. 25, 2008

Related U.S. Application Data

(60) Provisional application No. 60/896,025, filed on Mar. 21, 2007.

(51) Int. Cl.
*H04B 1/00* (2006.01)

(52) U.S. Cl. ........... 455/127.2; 455/127.5; 455/550.1; 375/260

(58) Field of Classification Search .......... 455/118, 455/127.1, 127.2, 127.5, 550.1; 375/260, 375/268, 271

See application file for complete search history.

(56) References Cited

U.S. PATENT DOCUMENTS

| | | | |
|---|---|---|---|
| 6,404,824 B1 | 6/2002 | Bell et al. | |
| 7,010,057 B2 | 3/2006 | Vayrynen et al. | |
| 7,904,104 B2 * | 3/2011 | Moon | 455/522 |
| 2003/0095498 A1 * | 5/2003 | Sato et al. | 370/208 |
| 2005/0064912 A1 * | 3/2005 | Yang et al. | 455/567 |
| 2005/0122166 A1 | 6/2005 | Premakanthan et al. | |
| 2005/0249312 A1 | 11/2005 | Bode et al. | |
| 2006/0071652 A1 | 4/2006 | Miura | |
| 2006/0223462 A1 | 10/2006 | Rahman et al. | |

* cited by examiner

*Primary Examiner* — Nhan Le
(74) *Attorney, Agent, or Firm* — Forefront IP Lawgroup, PLLC

(57) ABSTRACT

A digital modulator for a portable handset using 8PSK or EDGE modulation with a direct launch transmitter is used to controllably adjust the transmit power of the portable handset. The digital modulator includes a controller coupled between a memory and an accumulator. The controller is responsive to an indication that the transmit power should be transitioned. The controller temporarily alters the data transferred from the memory to the accumulator during transitions of the transmit power level.

6 Claims, 6 Drawing Sheets

DIGITAL MODULATOR AND METHOD FOR INITIATING RAMP POWER TRANSITIONS IN A MOBILE HANDSET TRANSMITTER

CROSS REFERENCE TO RELATED APPLICATION

This application claims priority to U.S. provisional application titled "IQ Ramp Down for 8PSK Modulation in EDGE Phone," having Ser. No. 60/896,025 filed on Mar. 21, 2007, which is entirely incorporated herein by reference.

BACKGROUND

This invention relates generally to transceiver architecture in a wireless portable communication device.

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband time-division multiple access (TDMA), a Gaussian minimum shift keying (GMSK) modulation scheme is used to communicate data.

The deployment of new wireless systems presents unique challenges to mobile handset designers. In order to reap the full benefit of expanded capacity and increased data bandwidth, the new handsets must work on both the new systems as well as the old. One of these new systems has been named Enhanced Data Rates for GSM Evolution (EDGE). The EDGE standard is an extension of the Global System for Mobile Communications (GSM) standard.

The EDGE standard increases the data rate over that available with GSM by sending more bits per RF burst. More bits are sent in EDGE by using a modulation scheme based on 8-phase shift keying (8PSK), which provides an increase over GSM's Gaussian minimum shift keying (GMSK) modulation format. In the EDGE modulation scheme, the 8PSK constellation is rotated 3/8 radians every symbol period to avoid problems associated with zero crossings. In contrast to GMSK's constant amplitude envelope, the EDGE modulation scheme results in a non-constant amplitude envelope. This non-constant amplitude in the output signal presents some difficulties with regard to RF power control.

During multi-slot operation of a mobile handset transmitter using 8PSK modulation, the power of the modulated radio-frequency (RF) signal is required to ramp-up to a desired power level for a set period of time during which the handset transmits encoded data symbols. After the transmission has completed, the power of the modulated RF signal is required to return or ramp down to an off power level. The ramp-up and ramp-down must be accomplished without adversely affecting time and frequency parameters defined by the EDGE communication standard.

One conventional approach to power control generates a signal that is used to controllably adjust the gain of a variable gain amplifier located in series with a linear power amplifier. For polar loop transmitter architectures, which are already operating near saturation in 8PSK mode, power control has been accomplished through power amplifier bias controls. These conventional power controllers require integrated circuit space, increase the power budget of the mobile handset and for some conditions require a longer time than that available to meet frequency spectrum requirements.

Another approach is introduced in U.S. Patent Application Publication 2005/0249312 to Bode et al. (the '312 publication). The '312 publication describes a digital modulator that introduces dips in the envelope of the I/Q signal between adjacent time intervals or bursts. A dip-shaped waveform is multiplied with each of the I and Q waveforms to introduce the dips. A pulse-shaping filter is used with the dip-shaped waveform to obtain the desired result in the envelope of the I/Q signal. This solution requires additional memory to store the dip waveform and integrated circuit space to implement the pulse-shaping filter.

Therefore, it would be desirable to provide dynamic power control in a mobile handset in an economic and efficient manner and in accordance with the EDGE communication standard across a broader range of operating conditions absent additional memory capacity or shaping filters.

SUMMARY

An embodiment of a digital modulator and method for initiating ramp power transitions in a mobile handset includes a memory, an accumulator and a controller inserted between the memory and the accumulator. The controller alters the transfer of stored symbols to the accumulator in response to an indication that the transmit power should be transitioned.

An embodiment of method for initiating ramp power transitions in a mobile handset includes the steps of inserting a controller between a memory element and an accumulator in a modulator and controllably directing the controller to alter the transfer of stored symbols from the memory element to the accumulator by applying a logic 0 at an input of the accumulator in response to an indication that the transmit power should be transitioned.

The figures and detailed description that follow are not exhaustive. The disclosed embodiments are illustrated and described to enable one of ordinary skill to make and use the digital modulator and method for initiating ramp power transitions in a mobile handset. Other embodiments, features and advantages of the modulator and method will be or will become apparent to those skilled in the art upon examination of the following figures and detailed description. All such additional embodiments, features and advantages are within the scope of the disclosed systems and methods as defined in the accompanying claims.

BRIEF DESCRIPTION OF THE FIGURES

The digital modulator and method for initiating ramp power transitions in a mobile handset can be better understood with reference to the following figures. The components within the figures are not necessarily to scale, emphasis instead being placed upon clearly illustrating the principles and operation of the modulator and the method. Moreover, in the figures, like reference numerals designate corresponding parts throughout the different views.

DETAILED DESCRIPTION

Figure 1:
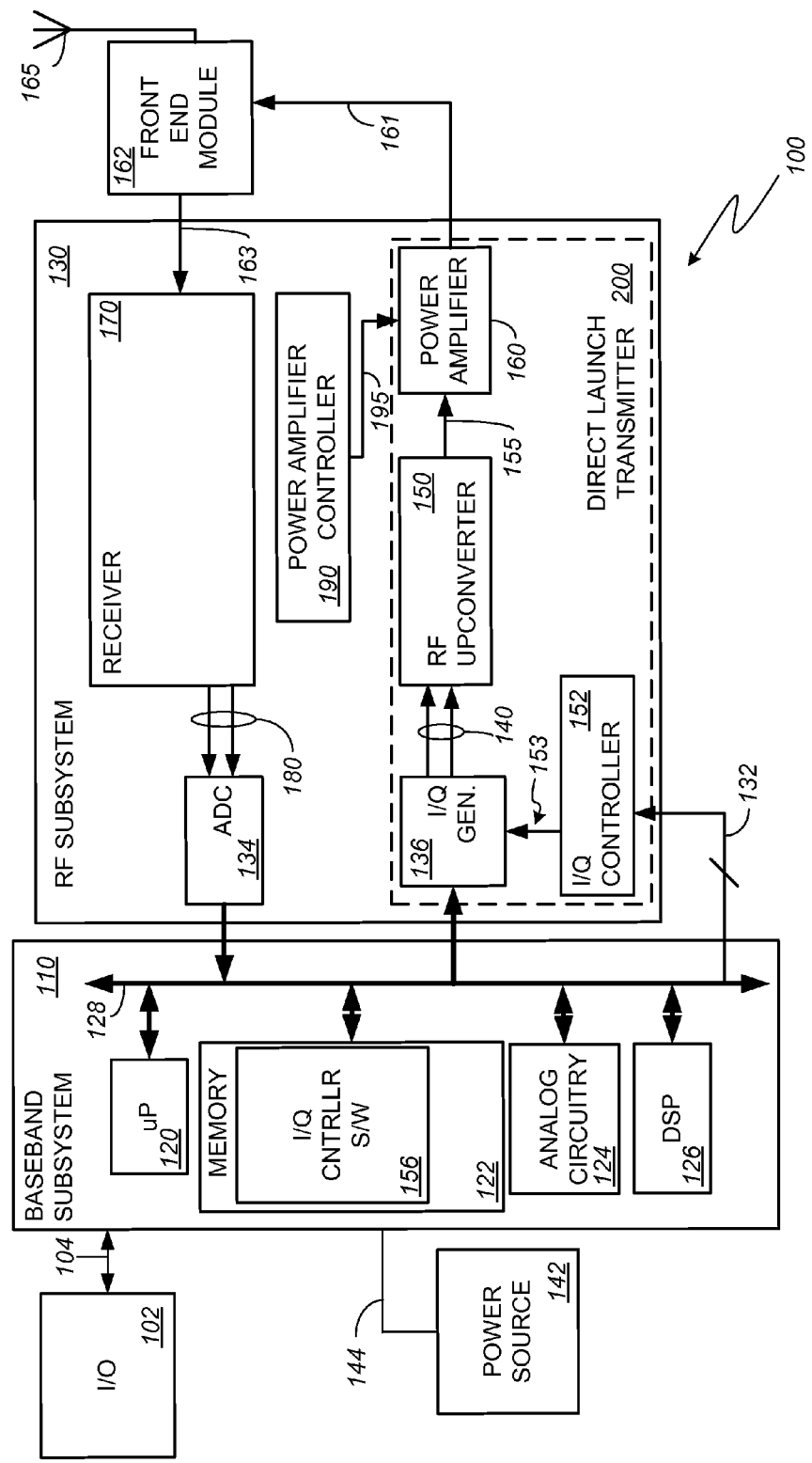
FIG. 1 is a block diagram illustrating a simplified portable transceiver including a direct launch transmitter.

Although described with particular reference to a portable transceiver operating under the EDGE (8PSK) modulation scheme, the modulator, controller and method for initiating ramp power transitions in a mobile handset can be implemented in any communication device where dynamic power control of a direct launch transmitter is desired.

The modulator, controller and method for initiating ramp power transitions in a mobile handset can be implemented in hardware, software, or a combination of hardware and software. When implemented in hardware, the modulator, controller and method can be implemented using specialized hardware elements and logic. When the modulator, controller and method are implemented partially in software, the software portion can be used to control one or more logic components inserted between a memory element and an accumulator so that various operating aspects can be software-controlled.

The software can be stored in a memory and executed by a suitable instruction execution system (microprocessor). The hardware implementation of the modulator, controller and method for initiating ramp power transitions in a mobile handset can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the controller and method for initiating ramp power transitions in a mobile handset comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an embodiment of a direct launch transmitter 200, which includes an I/Q generator 136, an I/Q controller 152 for initiating ramp power transitions and a RF upconverter 150 for generating a RF transmit signal in the portable transceiver 100. The portable transceiver 100 includes an input/output (I/O) element 102 coupled to a baseband subsystem 110 via connection 104. The I/O element 102 represents any interface with which a user may interact with the portable communication device 100. For example, the I/O element 102 may include a speaker, a display, a keyboard, a microphone, a trackball, a thumbwheel, or any other user-interface element. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone.

The baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the I/Q controller 152 and method for initiating ramp power transitions is implemented, the baseband subsystem 110 may also include one or more of an application specific integrated circuit (ASIC), a field programmable gate array (FPGA), or any other implementation-specific or general processor.

Microprocessor 120 and memory 122 provide the signal timing, processing and storage functions for portable transceiver 100. Analog circuitry 124 provides the analog processing functions for the signals within baseband subsystem 110. The baseband subsystem 110 provides data and control signals to a radio frequency (RF) subsystem 130. The RF subsystem 130 receives data from remote transmitters and forwards the received data to the baseband system 110 for further processing. The RF subsystem 130 includes the direct launch transmitter 200, a receiver 170, a power amplifier 160, and a power amplifier controller 190. The elements within the RF subsystem 130 can be controlled by signals from the baseband subsystem 110 via bus 132, which is connected to various baseband elements via bus 128. Alternatively, the direct launch transmitter 200 and the receiver 170 may be located on an RF integrated circuit (IC).

The baseband subsystem 110 generates various control signals, such as a power control signal, that are used to control the power amplifier controller 190 and the power amplifier 160, as known to those skilled in the art. The control signals on connection 132 may originate from the DSP 126, the microprocessor 120, or from any other processor within the baseband subsystem 110, and are supplied to a variety of connections within the direct launch transmitter 200, receiver 170, power amplifier 160, and the power amplifier controller 190. It should be noted that, for simplicity, only the basic components of the portable transceiver 100 are illustrated herein. The control signals provided by the baseband subsystem 110 control the various components within the portable transceiver 100. Further, the functions within the direct launch transmitter 200 and the receiver 170 may be integrated into a transceiver.

The power amplifier controller 190 generates a power amplifier (PA) power control signal. The power control signal is coupled to the power amplifier 160 via connection 195. The power control signal controls the power output of the power amplifier 160 based on various inputs. For example, in an embodiment, a closed power control loop may influence the power output of the power amplifier 160. In another embodiment, an open power control loop may influence the power output of the power amplifier 160. For example, in an embodiment, a signal received by a base station with which the portable communication device 100 is communicating may issue a power control signal. In other embodiments, the baseband subsystem 110 provides enable, standby and power control signals to the power amplifier controller 190. In turn, the power amplifier controller 190 processes the enable, standby and power control signals and generates a power control signal that is communicated to the power amplifier 160 on connection 195.

If portions of the I/Q controller 152 and method for initiating ramp power transitions in a mobile handset are implemented in software that is executed by the microprocessor 120, the memory 122 will also include I/Q controller software 156. The I/Q controller software 156 comprises one or more executable code segments that can be stored in the memory 122 and executed in the microprocessor 120. Alternatively, the functionality of the I/Q controller software 156 can be coded into an ASIC (not shown) or can be executed by an FPGA (not shown), or another device or may be integrated into a transceiver. Because the memory 122 can be rewritable and because a FPGA is reprogrammable, updates to the I/Q controller software 156 can be remotely sent to and saved in the portable transceiver 100 when implemented using either of these methodologies.

RF subsystem 130 also includes analog-to-digital converter (ADC) 134 and an in-phase quadrature-phase (I/Q) generator 136. In this example, the I/Q generator 136 generates the in-phase (I) and quadrature-phase (Q) signals that are 8PSK modulated signal before being forwarded to the RF upconverter 150 via connection 140. The ADC 134 and the I/Q generator 136 also communicate with microprocessor 120, memory 122, analog circuitry 124 and DSP 126 via bus 128. The I/Q generator 136 converts the digital communication information within baseband subsystem 110 into a digital signal for further processing by the RF upconverter 150 for transmission by the direct launch transmitter 200.

The I/Q generator 136 includes an 8PSK modulator that will be explained in greater detail in association with FIG. 3. The I/Q generator 136 and 8PSK modulator operate in accordance with a control signal provided on connection 153 from the I/Q controller 152. The I/Q controller 152, operating in accordance with one or more signals on bus 132, controllably interrupts the transfer of a modulated I signal and a modulated Q signal to respective transmit chains and mixers for upconversion to a transmit frequency. The RF upconverter 150 of the direct launch transmitter 200 combines and transforms the modulated signals to an appropriate transmit frequency and provides the upconverted signal to the power amplifier 160 via connection 155. The power amplifier 160 amplifies the signal to an appropriate power level for the system given present conditions under which the portable transceiver 100 is operating.

The I and Q components may take different forms and be formatted differently depending upon the communication standard being employed. For example, when the power amplifier 160 is used in a constant-amplitude, phase (or frequency) modulation application such as the global system for mobile communications (GSM), the phase modulated information is provided by a modulator within the direct launch transmitter 200. When the power amplifier 160 is used in an application requiring both phase and amplitude modulation such as, for example, extended data rates for GSM evolution, referred to as EDGE, the Cartesian in-phase (I) and quadrature (Q) components contain both amplitude and phase information.

The power amplifier 160 supplies the amplified signal via connection 161 to a front end module 162. The front end module 162 comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 165.

A signal received by an antenna 165 is directed from the front end module 162 to the receiver 170. The receiver 170 includes various components to downconvert, filter, demodulate and recover a data signal from a received signal, as known to those skilled in the art. If implemented using a direct conversion receiver (DCR), the receiver 170 converts the received signal from an RF level to a baseband level (DC), or a near-baseband level (~100 kHz). Alternatively, the received RF signal may be downconverted to an intermediate frequency (IF) signal, depending on the system architecture. The recovered transmitted information is supplied via connection 180 to the ADC 134. The ADC 134 converts these analog signals to a digital signal at baseband frequency and transfers the signal via bus 128 to DSP 126 for further processing.

Figure 2:
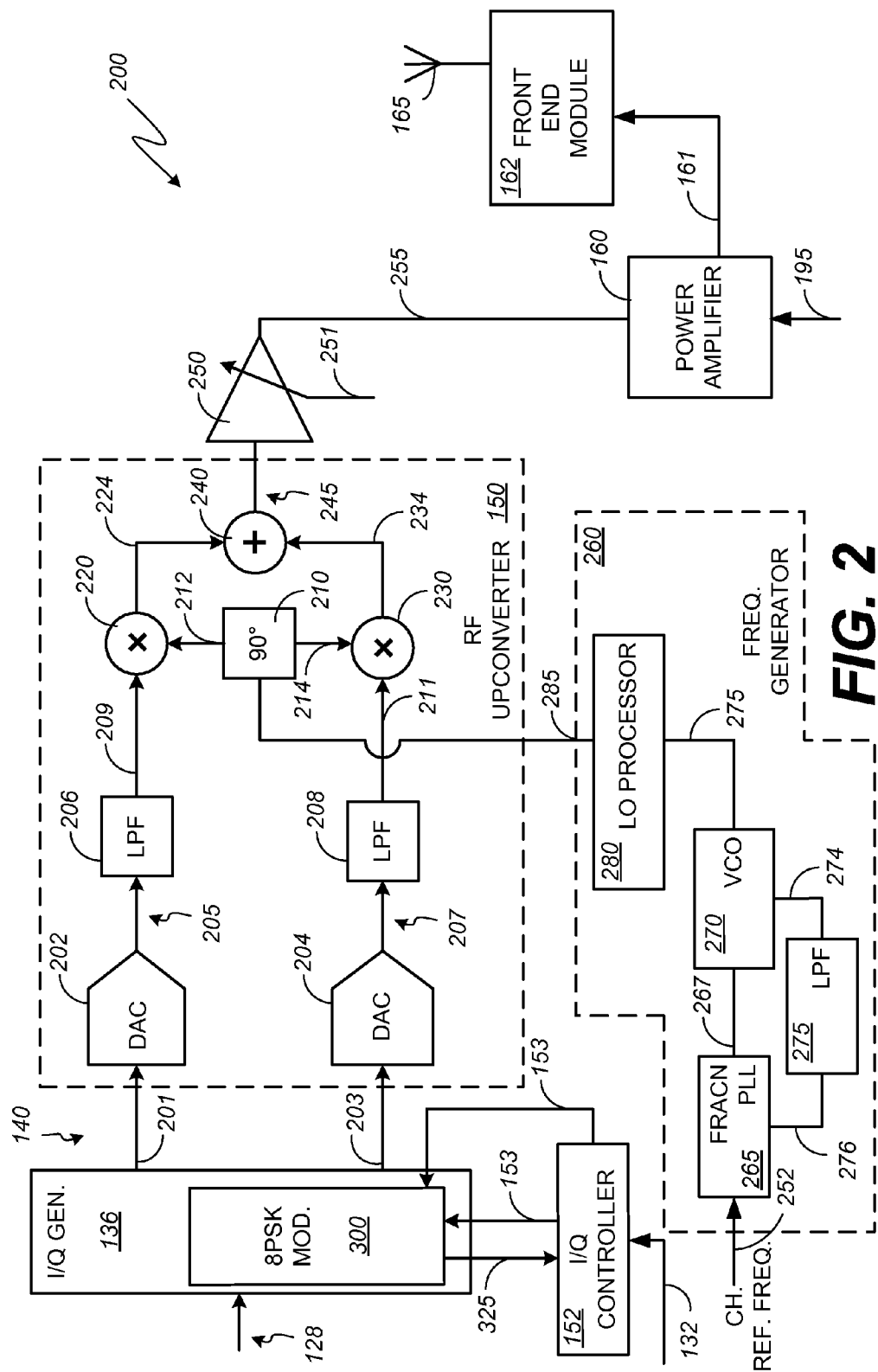
FIG. 2 is a schematic diagram illustrating an example embodiment of the direct launch transmitter of FIG. 1.

FIG. 2 is a schematic diagram illustrating details of an example embodiment of the direct launch transmitter 200 along with the variable gain amplifier 250, the power amplifier 160, front end module 162 and antenna 165 of FIG. 1. The direct launch transmitter 200 includes the I/Q controller 152, the I/Q generator 136 with an integrated 8PSK modulator 300, the RF upconverter 150 and a frequency generator 260. The RF upconverter 150 includes a digital-to-analog converter (DAC) 202, DAC 204, low-pass filter (LPF) 206, LPF 208, mixer 220, mixer 230, 90° phase shifter 210 and node 240.

The frequency generator 260 includes a fractional phase-locked loop (PLL) element 265, a voltage-controlled oscillator (VCO) 270, a LPF 275, and a LO processor 280 in a frequency processing portion.

The frequency generator 260 of the direct launch transmitter 200 receives a channel reference frequency on connection 252. The channel reference frequency may originate in a reference oscillator located in the baseband subsystem 110 or in the RF subsystem 130 of the portable transceiver 100. The channel reference frequency is processed by the fractional PLL element 265, the VCO 270 and the LPF 275. The VCO 270 receives an input signal along connection 267, which is coupled to the output of the fractional PLL 265. The output of the VCO 270 is coupled via connection 274 to the LPF 275. The output of the LPF 275 is coupled via connection 276 to the fractional PLL 265. In accordance with an adjustable number N, the combination of the fractional PLL element 265, the VCO 270 and the LPF 275 generate an output signal on connection 275 having a frequency that is N times the channel reference frequency provided on connection 252. The output signal on connection 275 is fine tuned in one or more of phase, frequency or amplitude as required before being forwarded along connection 285 to the 90° phase shifter.

Digital data is received by the I/Q generator 136 via connection 128. The I/Q generator 136 generates modulated I and Q data signals in accordance with the 8PSK modulation standard. In the embodiment illustrated in FIG. 2, the I/Q generator 136 functions in cooperation with the I/Q controller 152.

As will be explained in greater detail in association with FIG. 3, the I/Q generator 136 selects and provides a previously stored waveform in response to the data received on connection 325 to the I/Q controller 152. The I/Q controller 152 provides a data interrupt signal along connection 153 and a data output signal along connection 335.

When data is not interrupted by the I/Q controller 152, the I data signal is forwarded from the I/Q generator 136 via connection 201 to the DAC 202 and the Q data signal is forwarded from the I/Q generator 136 via connection 203 to DAC 204. The DAC 202 is coupled to LPF 206 via connection 205. The DAC 202 converts the I data signal into an analog signal, which is low-pass filtered by LPF 206 before being forwarded to the mixer 220 via connection 209. The mixer 220 receives a local oscillator signal from 90° phase shifter 210 along connection 212. The local oscillator signal, when applied by the mixer 220 upconverts the I data signal from a baseband frequency to a RF transmission frequency. The I data signal at the RF frequency is forwarded to node 240 via connection 224.

When data is not interrupted by the I/Q controller 152, the Q data signal is forwarded from the I/Q generator 136 via connection 203 to the DAC 204. The DAC 204 is coupled to LPF 208 via connection 207. The DAC 204 converts the Q data signal into an analog signal, which is low-pass filtered by LPF 208 before being forwarded to the mixer 230 via connection 211. The mixer 230 receives a local oscillator signal from 90° phase shifter 210 along connection 214. The local oscillator signal on connection 212 is at a first or reference phase. The local oscillator signal on connection 214 is shifted 90° from the local oscillator signal on connection 212. The local oscillator signal on connection 214, when applied by the mixer 230, upconverts the Q data signal from the baseband frequency to the RF transmission frequency. The Q data signal at the RF frequency is forwarded to node 240 via connection 234. The I and Q data signals are added by the node 240 and applied at an input to the variable gain amplifier 250 along connection 245. The variable gain amplifier 250, in accordance with a gain control signal applied at connection 251, amplifies the composite data signal and forwards the amplified data signal on connection 255 to the power amplifier 160.

The power amplifier 160 in accordance with the power control signal on connection 195 further amplifies the composite data signal on connection 255 and forwards the power amplified composite data signal via connection 161 to the front end module 162 and antenna 165.

Figure 3:
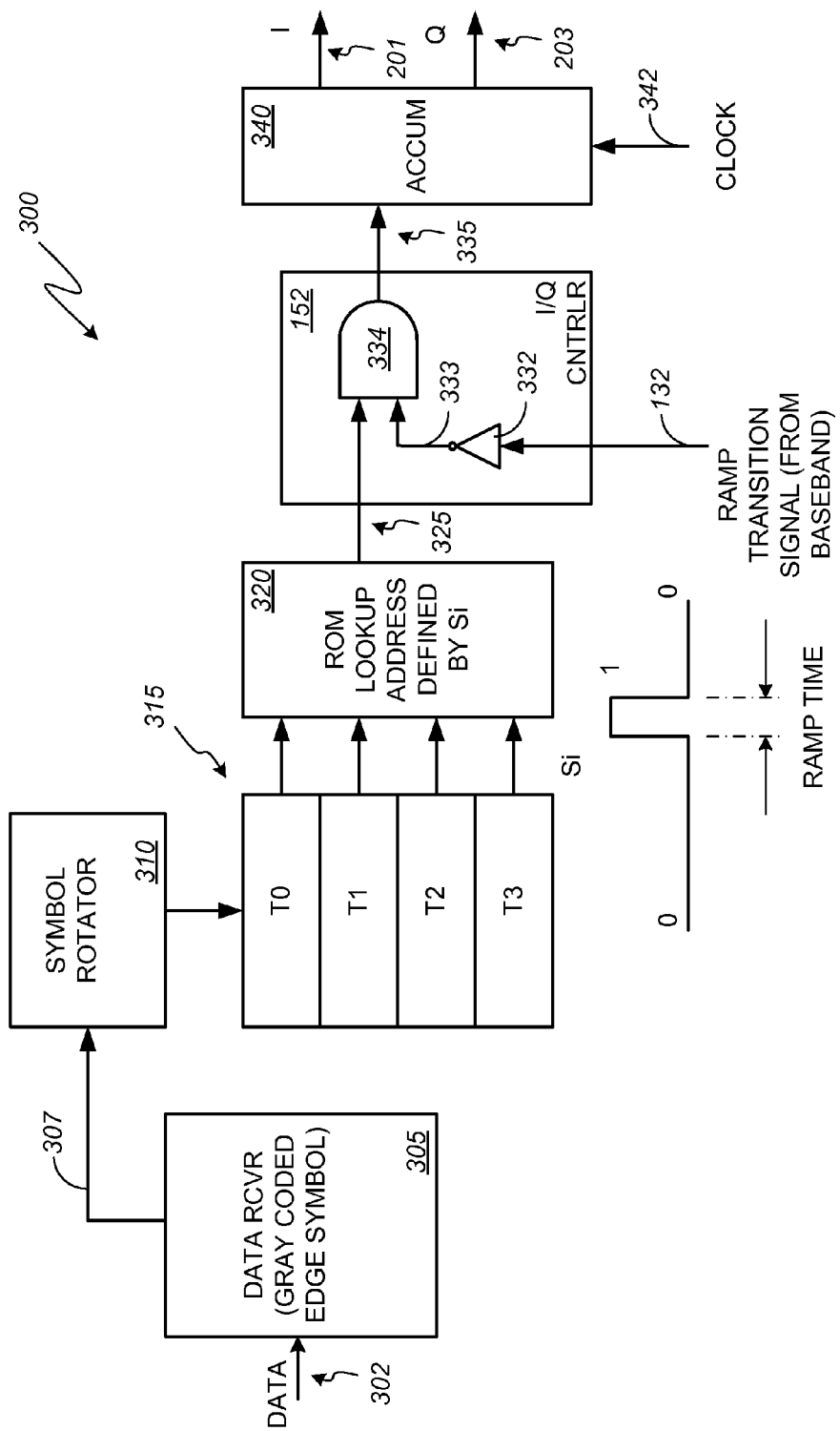
FIG. 3 is a schematic diagram of an embodiment of the digital modulator of FIG. 2.

FIG. 3 is a schematic diagram of an embodiment of the digital or 8PSK modulator 300 of FIG. 2. The 8PSK modulator 300 includes a data receiver element 305, a symbol rotator 310, a read-only memory element 320, the I/Q controller 152 and an accumulator 340. The data receiver element 305 receives the digital data signal on connection 302. The 3-bit gray coded EDGE symbol, is forwarded to the symbol rotator 310 via connection 307. The symbol rotator shifts the received gray coded EDGE symbol by 3π/8 as directed by the EDGE (8PSK) modulation standard. As indicated by the four time slots labeled T0, T1, T2 and T3, the phase shifted (i.e., rotated) gray coded EDGE symbol comprising an I and a Q component identify a symbol address Si. The symbol address, which is dependent upon the values of I and Q is used to direct the read-only memory element 320 to forward a previously stored representation of a waveform Si on connection 325 to the I/Q controller 152. The I/Q controller 152 processes the received waveform on connection 325 in accordance with a ramp transition signal forwarded from the baseband subsystem 110 on bus 132. As shown in FIG. 3, the ramp transition signal is at a logic 0 level before and after a ramp down transition. Conversely, the ramp transition signal is at a logic 1 during a ramp down transition. The ramp transition signal on connection 132 is at a logic 1 before a ramp-up transition and remains at a logic 0 during normal transmission or flat area of transmit time mask. The ramp transition signal on connection 132 is at a logic 1 again during ramp-down transition after the flat area of transmit time mask. The accumulator 340 receives the output waveform after processing by the I/Q controller 152 via connection 335. The accumulator 340 processes the previously stored waveform in accordance with a clock signal provided on connection 342 and forwards an I data signal on connection 201 and a Q data signal on connection 203. The accumulator 340 integrates and filters the time varying data represented by the stored waveform to meet the power vs. time mask and spectrum requirement specified by the EDGE communication standard.

In the illustrated embodiment, the I/Q controller 330 includes a logic inverter 332 and logic AND gate 334. The logic AND gate 334 receives a first input via connection 325 from the read-only memory element 320 and a second input on connection 333 from the output of the inverter 332. The combination of the inverter 332 and AND gate 334 generates a logic 0 at the output of the I/Q controller 152 (i.e., on connection 335) when the input to the combination on connection 132 is at a logic 1 and the data from the read-only memory element 320 on connection 325 is at a logic 1. Otherwise, the inverter 332 and AND gate 334 forward the data on connection 325 from the read-only memory element 320 via connection 335 to the accumulator 340. Entering a logic zero at the input to the accumulator 340 reduces the output of accumulator 340 smoothly and provides a ramp transition on the I and Q signal.

Figure 4:
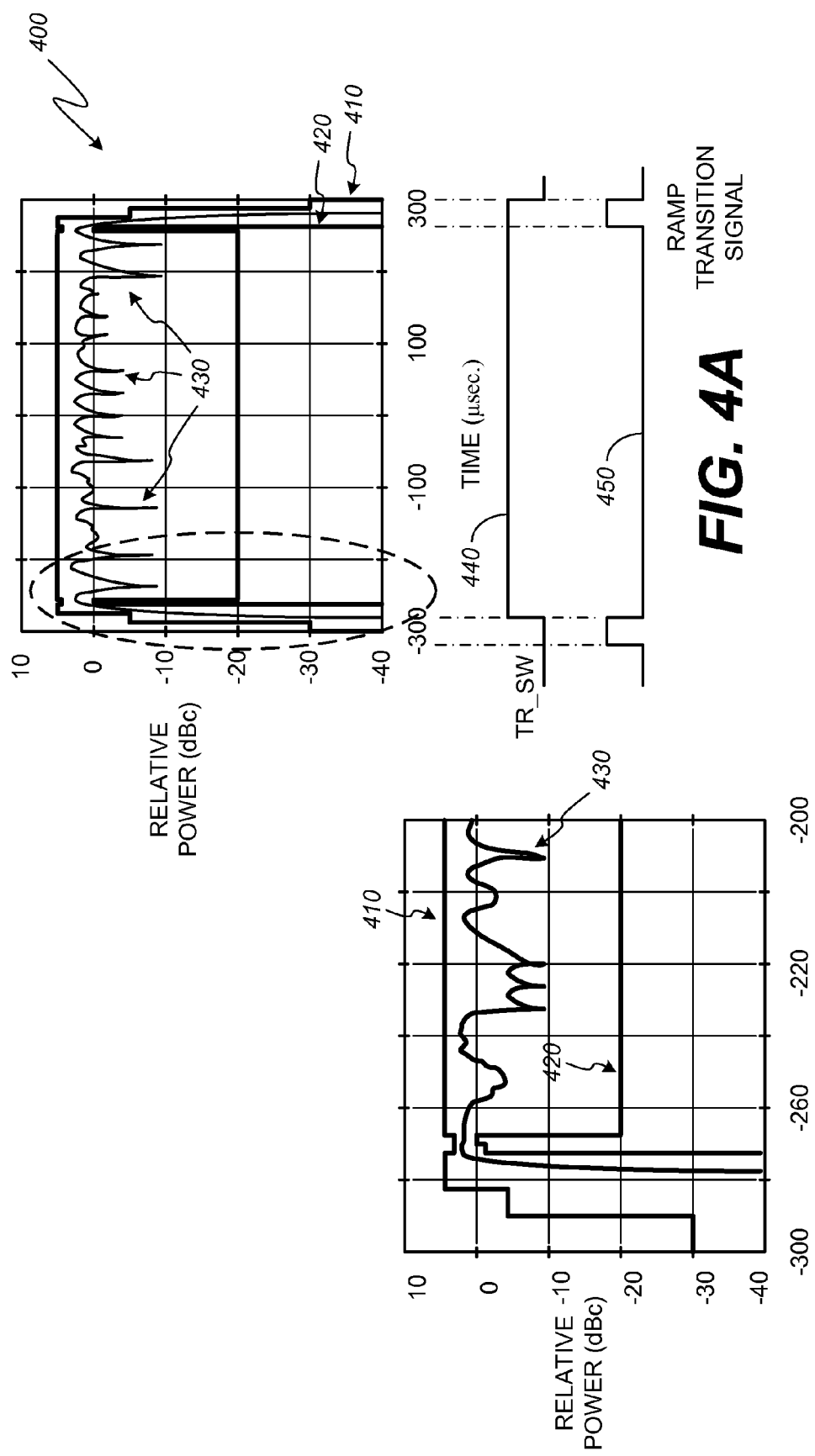
FIGS. 4A and 4B are graphical representations of the modulated signal power vs. time generated by the digital modulator and I/Q controller of FIG. 3.

FIG. 4A is a graphical representation of the relationship between the power vs. time mask as defined by the EDGE communication standard (8PSK modulation) and the modulated data signal output power. Plot 400 depicts time (μsec.) along a horizontal axis and relative power (dBc) along the vertical axis. A reference time or 0 μsec approximately defines the center of the represented data transmission. Example timing signals are shown below the plot. Trace 440 represents a signal labeled TX_SW. The TR_SW signal defines a data transmission period during which data symbols will be transmitted from the handset. The trace 450 represents a ramp transition signal. The trace 450 changes from a logic 0 level to a logic 1 level just before a ramp up transition is desired in the modulated data signal power. The trace 450 returns to logic level 0 during the data transmission as indicated by the relation to the TR_SW signal. The trace 450 changes from a logic level 0 to a logic level 1 just before a ramp down transition is desired in the modulated data signal power. The trace 450 returns to logic level 0 after the ramp down transition and the completion of the data transmission.

Trace 410 represents the upper limit of the power vs. time mask as defined by the EDGE standard for 8PSK modulation. Trace 420 represents the lower limit of the power vs. time mask as defined by the EDGE standard for 8PSK modulation. To be compliant, the modulated data signal power should remain within the upper and lower limits before, during and after burst transmissions. An example modulated data signal power over time generated by the system 300 (the system including the 8PSK modulator and the I/Q controller 152) is represented by trace 430. As indicated in FIG. 4A, the trace 430 ramps or transitions smoothly from −40 dBc to approximately 4 dBc from approximately −280 μsec. to −275 μsec. The measurement unit dBc is indicative of decibels relative to a carrier frequency. Thus, dBc specifies the power of a sideband in a modulated signal relative to the carrier in decibels.

The described ramp-up transition occurs in conjunction with the ramp transition signal provided on connection 224 to the I/Q controller 152 (FIG. 3). A data transmission period coincides with the peaks of the lower limit of the power vs. time mask as indicated by trace 420. During the data transmission, the trace 430 varies in amplitude between approximately 4 dBc to approximately −10 dBc. Thereafter, the trace 430 ramps or transitions smoothly from approximately 4 dBc to below −40 dBc from approximately 275 μsec to 280 μsec.

FIG. 4B is a graphical representation of the relationship between the power vs. time mask as defined by the EDGE communication standard (8PSK modulation) and the modulated data signal output power represented by trace 430. The time scale in FIG. 4B coincides with the period from −300 μsec to −200 μsec as indicated by the dashed line in the plot of FIG. 4A. As indicated in FIG. 4B, the modulated data signal output power remains within the upper and lower limits (i.e., within the boundaries defined by trace 410 and trace 420) of the EDGE communication standard power vs. time mask.

Figure 5:
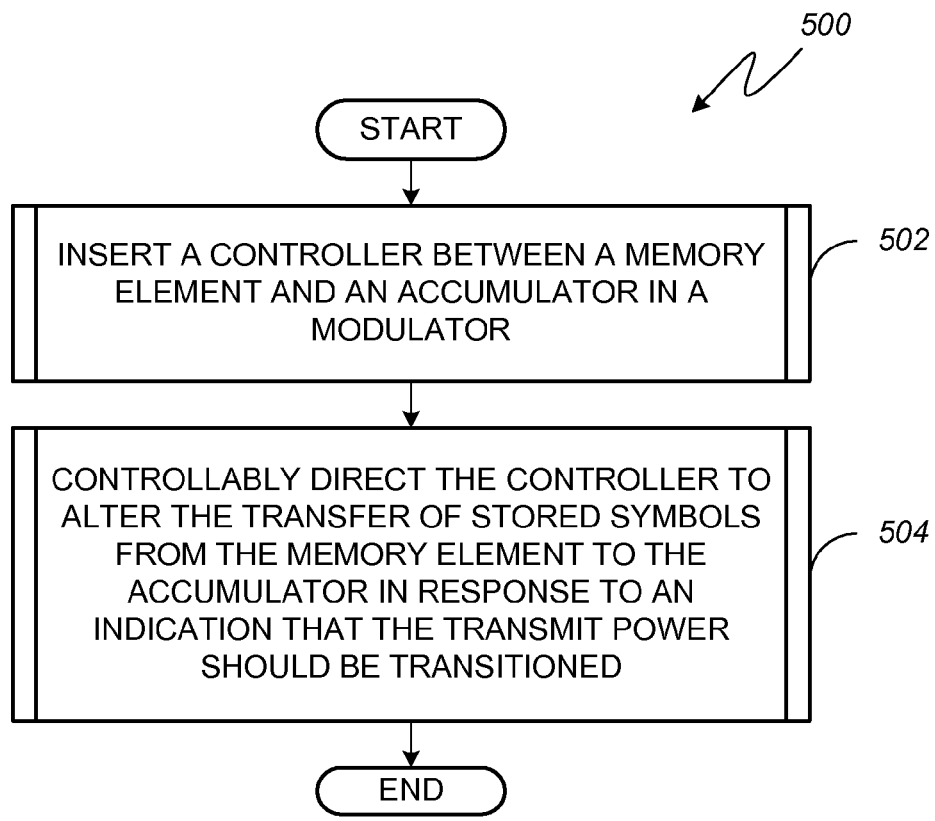
FIG. 5 is a flow chart illustrating an embodiment of a method for initiating power transitions in a mobile handset.

FIG. 5 is a flow chart illustrating the operation of an embodiment of a method for initiating ramp power transitions in a mobile handset transmitter. The flow diagram of FIG. 5 shows the architecture, functionality, and operation of a possible implementation via software and or firmware associated with a controller arranged with a digital modulator in a direct launch transmitter. In this regard, a block can represent a module, segment, or portion of code, which comprises one or more executable instructions for implementing the specified function(s). When a controller (associated with the digital modulator) is implemented via hardware, hardware and firmware or a combination of hardware and software, one or more blocks in the flow diagram may represent a circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 500 begins with block 502 where a controller is inserted between a memory element and an accumulator of a digital modulator. Thereafter, as indicated in block 504, the controller interrupts the transfer of stored symbols from the memory to the accumulator, by inserting a logic 0 at the input to the accumulator, in response to an indication that the transmit power should be transitioned.

Figure 6:
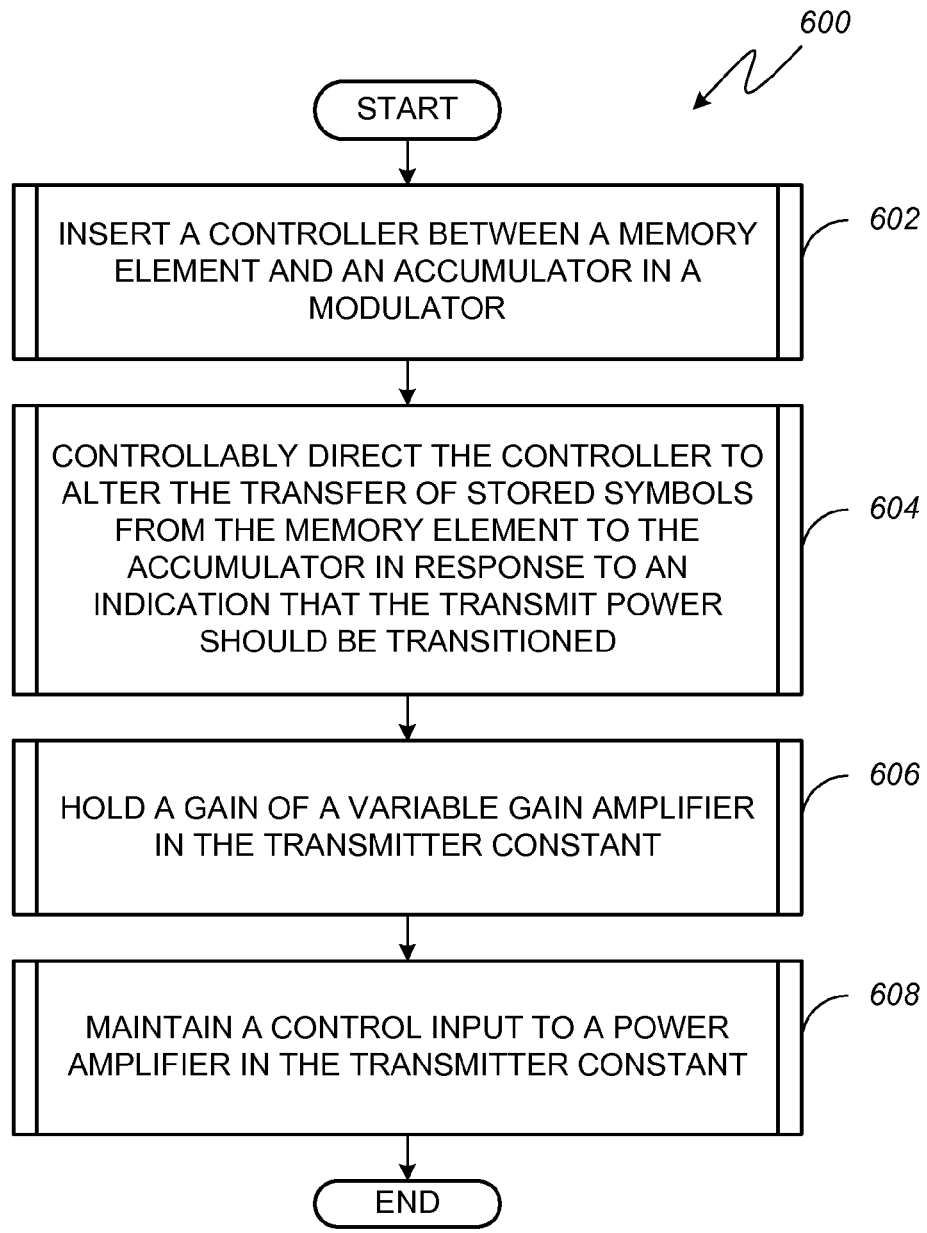
FIG. 6 is a flow chart illustrating an embodiment of an alternative method for initiating power transitions in a mobile handset.

FIG. 6 is a flow chart illustrating the operation of an embodiment of an alternative method for initiating ramp power transitions in a mobile handset transmitter. The flow diagram of FIG. 6 shows the architecture, functionality, and operation of a possible implementation via software and or firmware associated with a controller arranged with a digital modulator in a direct launch transmitter. In this regard, a block can represent a module, segment, or portion of code, which comprises one or more executable instructions for implementing the specified function(s). When the controller (associated with the digital modulator) is implemented via hardware, hardware and firmware or a combination of hardware and software, one or more blocks in the flow diagram may represent a circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 600 begins with block 602 where a controller is inserted between a memory element and an accumulator of a digital modulator. Thereafter, as indicated in block 604, the controller interrupts the transfer of stored symbols from the memory to the accumulator, by inserting a logic 0 at the input to the accumulator, in response to an indication that the transmit power should be transitioned. While the controller is interrupting the transfer of stored symbols from the memory to the accumulator the control input of the variable gain amplifier in the direct launch transmitter is being held constant as shown in block 606. Additionally, as indicated in block 608, a control signal applied to the power amplifier in the direct launch transmitter is held constant. The combination of keeping the gain of the variable gain amplifier constant and the control signal to the power amplifier constant while applying the power transition signal enables the digital modulator to provide the desired frequency and time domain responses during ramp up and ramp down transitions of the transmit power level.

While various embodiments of the digital modulator, the I/Q controller and method for initiating ramp power transitions in a mobile handset have been described, it will be apparent to those of ordinary skill in the art that many more embodiments and implementations are possible that are within the scope of this disclosure. Accordingly, the digital modulator, I/Q controller and method are not to be restricted except in light of the attached claims and their equivalents.

What is claimed is:

1. A digital modulator for a portable handset that uses a direct launch transmitter, the digital modulator, comprising:
   a memory;
   an accumulator; and
   a controller coupled between the memory and the accumulator, the controller configured to alter the transfer of stored symbols to the accumulator in response to an indication that a transition is desired in the transmit power of the portable handset,
   wherein the controller comprises a logic gate and an inverter.

2. The digital modulator of claim 1, wherein the logic gate comprises an AND gate.

3. The digital modulator of claim 1, wherein the controller receives the indication from a signal that originates in a baseband of the handset.

4. The digital modulator of claim 1, wherein the controller interrupts the communication of symbols to the accumulator.

5. The digital modulator of claim 4, wherein the controller interrupts the communication of symbols to the accumulator for the duration of two symbols.

6. The digital modulator of claim 4, wherein the controller interrupts the communication of symbols to the accumulator before a ramp up transition and at a ramp down transition.

* * * * *